United States Patent [19]
Beck et al.

[11] Patent Number: 5,973,021
[45] Date of Patent: Oct. 26, 1999

[54] RADIATION CURABLE FLUORINATED ORGANOSILOXANE COMPOSITIONS

[75] Inventors: James Anderson Beck, Midland; Myron Timothy Maxson, Sanford; Bernard VanWert, Midland, all of Mich.

[73] Assignee: Dow Corning Corporation, Midland, Mich.

[21] Appl. No.: 08/992,241

[22] Filed: Dec. 17, 1997

Related U.S. Application Data

[63] Continuation of application No. 08/616,014, Mar. 14, 1996, abandoned.

[51] Int. Cl.⁶ .............................. C08G 83/08; C08G 83/07
[52] U.S. Cl. ................................. 522/40; 522/42; 522/44; 522/99; 522/180; 528/32
[58] Field of Search .................................. 522/99, 40, 42, 522/44, 180; 528/32

[56] References Cited

U.S. PATENT DOCUMENTS

| | | | |
|---|---|---|---|
| 2,979,519 | 4/1961 | Pierce et al. | 260/448.2 |
| 3,719,619 | 3/1973 | Nugata et al. | 260/22 |
| 4,595,471 | 6/1986 | Preiner et al. | 522/29 |
| 4,719,275 | 1/1988 | Benditt et al. | 528/15 |
| 4,810,731 | 3/1989 | Hida et al. | 522/33 |
| 5,063,102 | 11/1991 | Lee et al. | 428/209 |

*Primary Examiner*—Susan W. Berman
*Attorney, Agent, or Firm*—Catherine U. Brown

[57] ABSTRACT

Organosiloxane compositions that cure in the presence of ultraviolet radiation comprise a alkenyl-substituted fluorinated polyorganosiloxane, a mercaptoalkyl-substituted fluorinated polyorganosiloxane and a photoinitiator. The cured compositions are particularly useful as coating and encapsulants to protect electronic devices that are exposed to hydrocarbon fuels.

17 Claims, No Drawings

RADIATION CURABLE FLUORINATED ORGANOSILOXANE COMPOSITIONS

This application is a continuation of application Ser. No. 08/616,014 filed Mar. 14, 1996, which application is now abandoned.

BACKGROUND OF THE INVENTION

1. Field of the Invention

This invention relates to radiation curable organosiloxane compositions. More particularly, this invention relates to fluorinated organosiloxane compositions that cure upon exposure to ultraviolet radiation to yield gels and elastomers that are resistant to solubilization in liquid hydrocarbon, exhibit improved electrical performance and provide suitable coatings and encapsulants for electronic components.

2. Description of the Related Art

In U.S. Pat. No. 4,719,275, issued on Jan. 12, 1988, Benditt et al. teach fluorosilicone compositions that cure via hydrosilylation reactions. These compositions contain a fluorinated polyorganosiloxane, a fluorine containing organohydrogensiloxane and a platinum catalyst.

In U.S. Pat. No. 5,063,102, issued on Nov. 5, 1991, Lee et al. teach a radiation curable organosiloxane gel comprising a polymethylsiloxane containing $(CH_3)_2SiO$, $CH_3SiO_{1.5}$, $(CH_3)_3SiO_{0.5}$, and other siloxane units; a mercaptoalkyl-substituted polyorganosiloxane; and a photoinitiator.

In U.S. Pat. No. 5,302,627, issued on Apr. 12, 1994, Field et al. teach a method for indicating a cure point for an ultraviolet radiation curing composition comprising the step of adding a dye with a visible color to an ultraviolet curable composition. Field et al. also teach an ultraviolet curable composition comprising a polymethylsiloxane containing $(CH_3)_2SiO$, $CH_3SiO_{1.5}$, $(CH_3)_3SiO_{0.5}$, and other siloxane units; and a mercaptoalkyl- and halohydrocarbon-substituted polyorganosiloxane.

The unique physical and chemical properties of fluorinated organosiloxanes make them desirable as coatings and encapsulants for electrical and electronic devices to protect these devices from moisture, other contaminants and mechanical abuse, all of which can cause the device to malfunction or become inoperative.

Electronic components associated with electronic ignition and emission control systems of automobiles and other vehicles powered by internal combustion engines are often located in the engine compartment of the vehicle where they are exposed to various hydrocarbons including hydrocarbon fuels and lubricating fluids.

The introduction of fluorinated hydrocarbon radicals into a polyorganosiloxane to impart resistance to swelling and/or solubilization by the liquid hydrocarbons present in gasoline and other fuels is disclosed in U.S. Pat. No. 2,979,519, which issued to Pierce et al. on Apr. 11, 1961 and U.S. Pat. No. 3,719,619, which issued to Brown on Apr. 20, 1965.

The present inventors discovered that when compositions comprising an alkenyl-substituted fluorinated polyorganosiloxane; a mercaptoalkyl-substituted fluorinated polyorganosiloxane; and a photoinitiator are exposed to ultraviolet radiation, the compositions cure in a minute or less and that cured gels and elastomers so prepared are resistant to solubilization in liquid hydrocarbons. Moreover, cured gels and elastomers prepared using the compositions of the present invention have unexpectedly improved electrical performance when used in electronic modules.

SUMMARY OF THE INVENTION

The present invention provides fluorinated organosiloxane compositions that cure in the presence of ultraviolet radiation comprising an alkenyl-substituted fluorinated polyorganosiloxane, a mercaptoalkyl-substituted fluorinated polyorganosiloxane and a photoinitiator.

DETAILED DESCRIPTION OF THE INVENTION

The present invention provides an ultraviolet radiation curable fluorinated organosiloxane composition comprising:

A) an alkenyl-substituted fluorinated polyorganosiloxane containing an average of at least two alkenyl groups per molecule and having the general formula

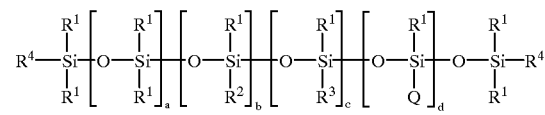

B) a mercaptoalkyl-substituted fluorinated polyorganosiloxane containing an average of at least two mercapto groups per molecule and having the general formula

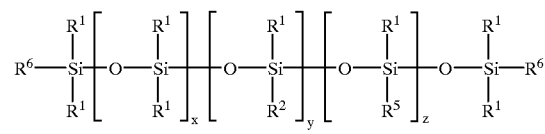

C) a photoinitiator in an amount sufficient to promote curing of the composition in the presence of ultraviolet radiation;

where Q is represented by the general formula

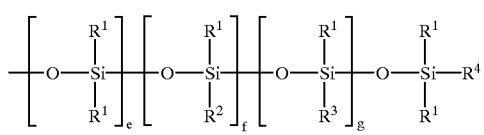

and where $R^1$ is an alkyl group, $R^2$ is a fluorinated hydrocarbon group, $R^3$ is an alkenyl group, $R^4$ is selected from the group consisting of $R^1$ and $R^3$, $R^5$ is a mercaptoalkyl group, $R^6$ is selected from the group consisting of $R^1$ and $R^5$, a is number $\geq 0$, b is a number $\geq 3$, c is a number $\geq 0$, d is a number $\geq 0$, x is a number $\geq 0$, y is a number $\geq 3$, z is a number $\geq 0$, e is number $\geq 0$, f is a number $\geq 0$, g is a number $\geq 0$, and the sum of the average number of alkenyl radicals in component A and the average number of mercaptoalkyl radicals in component B is greater than four.

A. The Alkenyl-Substituted Fluorinated Polyorganosiloxane (Ingredient A)

Ingredient A is an alkenyl-substituted fluorinated polyorganosiloxane containing an average of at least two alkenyl radicals per molecule. Ingredient A can be either a homopolymer or a copolymer and is represented by the general formula

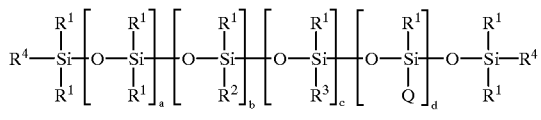

where Q is represented by the general formula

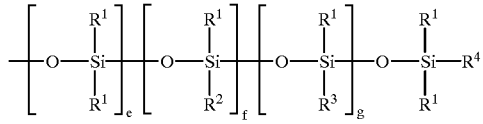

and where $R^1$ is an alkyl group, $R^2$ is a fluorinated hydrocarbon group, $R^3$ is an alkenyl group, $R^4$ is selected from the group consisting of $R^1$ and $R^3$, a is number $\geq 0$, b is a number $\geq 3$, c is a number $\geq 0$, d is a number $\geq 0$, e is a number $\geq 0$, f is a number $\geq 0$, and g is a number $\geq 0$.

When the value of d is zero, the alkenyl-substituted fluorinated polyorganosiloxane is a linear molecule. When d has a value greater than zero, the alkenyl-substituted fluorinated polyorganosiloxane is a branched molecule.

$R^1$ is preferably an alkyl group having 1 to 4 carbon atoms. More preferably, $R^1$ is a methyl group. The preferred fluorinated hydrocarbon group, which is represented by $R^2$, is a radical of the formula $RfCH_2CH_2$—, where Rf represents a monovalent perfluorinated hydrocarbon radical containing from 1 to 10 carbon atoms. In more preferred embodiments, $R^2$ is 3,3,3-trifluoropropyl. Ingredient A contains at least two alkenyl radicals represented by the formula $R^3$. The alkenyl radicals are preferably located on the terminal ends of the alkenyl-substituted fluorinated polyorganosiloxane of Ingredient A. In preferred embodiments, each $R^3$ is individually selected from the group consisting of vinyl radicals, allyl radicals and 5-hexenyl radicals. In more preferred embodiments, each $R^3$ is a vinyl radical.

The viscosity of ingredient A can range from a free flowing liquid to a semi-solid gum. In preferred embodiments the number average degree of polymerization of Ingredient A is from 3 to about 2000. In more preferred embodiments the number average degree of polymerization is 15 to 1000. In most preferred embodiments the number average degree of polymerization is 30 to 100.

A preferred embodiment of ingredient A is a polydiorganosiloxane wherein from 20 to about 95 mole percent of the diorganosiloxane units are methyl-3,3,3-trifluoropropylsiloxane, the remaining diorganosiloxane units are dimethylsiloxane, and the terminal units are dimethylvinylsiloxy.

Upon curing, compositions of the present invention yield gels and elastomers that are resistance to solubilization in hydrocarbon liquids. Ingredient A is believed by the inventors to be responsible for this resistance to solubilization.

B. The Curing Agent (Ingredient B)

The alkenyl-substituted fluorinated polyorganosiloxane (Ingredient A) of the present invention, is cured by reacting with a mercaptoalkyl-substituted fluorinated polyorganosiloxane containing an average of at least two mercaptoalkyl groups per molecule. The mercaptoalkyl-substituted fluorinated polyorganosiloxane that constitutes Ingredient B is of the general formula

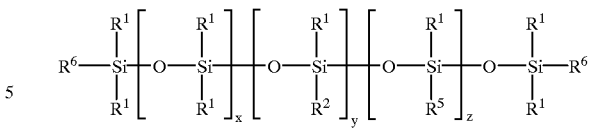

where $R^1$ is an alkyl group, $R^2$ is a fluorinated hydrocarbon group, $R^5$ is a mercaptoalkyl group, $R^6$ is selected from the group consisting of $R^1$ and $R^5$, x is a number $\geq 0$, y is a number $\geq 3$, z is a number $\geq 0$.

One requirement of this ingredient is that it be compatible with the other ingredients of the present curable compositions.

$R^1$ is preferably an alkyl group containing 1 to 4 carbon atoms. More preferably, $R^1$ is a methyl group. The preferred fluorinated hydrocarbon group, which is represented by $R^2$, is a radical of the formula $RfCH_2CH_2$—, where Rf represents a monovalent perfluorinated hydrocarbon radical containing from 1 to about 10 carbon atoms. In more preferred embodiments, $R^2$ is 3,3,3-trifluoropropyl. The preferred $R^5$ is a mercaptopropyl radical. The preferred $R^6$ is a methyl radical.

In preferred embodiments the number average degree of polymerization of Ingredient B is from 3 to about 2000. In more preferred embodiments the number average degree of polymerization is 15 to 1000. In most preferred embodiments the number average degree of polymerization is 30 to 100.

In preferred embodiments of the present invention, the molar ratio of mercaptoalkyl radicals in Ingredient B to alkenyl radicals in Ingredient A is from 0.25:1 to 2:1. In more preferred embodiments, the molar ratio is from 0.25:1 to 1:1. In order to form a crosslinked polymer upon exposure to ultraviolet radiation, the sum of the average number of alkenyl radicals in Ingredient A and the average number of mercaptoalkyl radicals in Ingredient B in compositions of the present invention must be greater than 4.

A preferred embodiment of ingredient B is a polydiorganosiloxane wherein from 20 to about 95 mole percent of the diorganosiloxane units are methyl-3,3,3-trifluoropropylsiloxane, 0.2 to about 50 mole percent of the diorganosiloxane units are methyl-mercaptopropylsiloxane units and the remaining diorganosiloxane units are dimethylsiloxane, and the terminal units are trimethylsiloxy.

C. The Photoinitiator (Ingredient C)

The photoinitiator identified as Ingredient C can be any compound that will initiate a reaction between the silicon-bonded alkenyl radicals of Ingredient A and the silicon-bonded mercaptoalkyl radicals of Ingredient B when the curable compositions of this invention are exposed to ultraviolet radiation. One requirement of the photoinitiator is that it compatible with the other ingredients of the present compositions. Compatibility can be readily determined by blending one weight percent of the candidate with the other ingredients of the curable composition and mixing the resultant composition at room temperature or by heating to a temperature of about 80° C. The resultant composition should be clear without any dispersed or precipitated material.

A second requirement of the photoinitiator is that it does not cause the ingredients of the curable composition to react with one another in the absence of ultraviolet radiation.

Photoinitiators that can be used in the present curable compositions include but are not limited to benzophenone, acetonaphthone, acetophenone, benzoin methyl ether, benzoin isobutyl ether, 2-hydroxy-2-methyl-1-phenylpropan-1- one, 1-hydroxycyclohexyl phenyl ketone, 2,2-diethoxyacetophenone, 3-hydroxypropylphenyl ketone and 3-hydroxypropyl-p-isopropylphenyl ketone. Preferred photoinitiators include 2-hydroxy-2-methyl-1-phenylpropan-1-one, 1-hydroxycyclohexylphenyl ketone, 2,2-diethoxyacetophenone, and 3-hydroxypropyl phenyl ketone.

Other classes of useful photoinitiators include compatible polysilanes of the type described by West in U.S. Pat. No. 4,260,780, which issued on Apr. 7, 1981; the aminated methylpolysilanes described by Baney et al. in U.S. Pat. No. 4,314,956, which issued on Feb. 9, 1982; the methylpolysilanes described by Peterson et al in U.S. Pat. No. 4,276,424, which issued on Jun. 30, 1981; and the polysilastyrene described by West et al. in U.S. Pat. No. 4,324,901, which issued on Apr. 13, 1982. All of these U.S. patents are incorporated herein by reference as teachings of suitable photoinitiators.

D. Optional Ingredients

The compositions of the present invention may also contain various optional ingredients. The compositions may contain up to about one weight percent of conventional viscosity stabilizer to inhibit gelation during storage. Acceptable stabilizers limit the increase in viscosity during a 24 hour period at 100° C. to a factor of less than two, i.e. a doubling of viscosity.

Examples of suitable viscosity stabilizers include amines, such as 2-(diisopropylamino)ethanol and trioctylamine and free radical scavengers such a p-methoxyphenol, catechol, hydroquinone and 2,6-di-t-butyl-p-methylphenol.

To insure complete curing of the present compositions, it may be desirable to include as one of the ingredients an organic peroxide that decomposes at a temperature within the range of from about 100° C. to about 250° C. This is particularly true if the substrate to which the composition will be applied is contoured such that a portion of the curable composition is shielded from ultraviolet radiation to which the coated substrate is subsequently exposed for the purpose of curing the composition.

The compositions of the present invention may contain a reinforcing filler or other type of reinforcing agent to improve the physical properties of the cured material. In those applications where transparency of the cured gel or elastomer is a requirement, the reinforcing agent is preferably a finely divided hydrophobic silica of the type described in U.S. Pat. No. 4,344,800, which issued on Aug. 17, 1992. The disclosure of this patent is incorporated into this specification by reference as teaching silica fillers that are suitable for use in compositions of this invention.

E. Preparation And Curing Of The Curable Compositions

The ingredients of the present composition are blended to form a homogeneous mixture using any of the known techniques that will not adversely affect the storage stability of the composition in the absence of ultraviolet radiation. Unless the composition exhibits borderline storage stability in the absence of ultraviolet radiation, the order in which the ingredients are added is not critical. If the ingredients have a tendency to react, it is preferable that alkenyl-substituted fluorinated polyorganosiloxane be added first, followed by the viscosity stabilizer and lastly, the mercaptoalkyl-substituted polyorganosiloxane and the photoinitiator. Curable compositions containing a viscosity stabilizer can typically be stored for longer than about 6 months under ambient conditions In order to obtain cured organosiloxane materials exhibiting useful physical properties using conventional processing equipment, the compositions of the present invention preferably have a viscosity, at 25° C., in the range of 200 to 2000 centipoise. More preferably, the viscosity is within the range of 500 to 1200 centipoise. In preferred embodiments, the compositions of the present invention, upon exposure to ultraviolet radiation, cure to form fluorosilicone gels that have penetration values ranging from about 2 to 20 millimeters, exhibit adhesion to plastic and metal substrates, and are resistant to solubilization in hydrocarbon liquids. Penetration values in the range of 2 to 20 millimeters are needed to protect delicate electronic components when the compositions of the present invention are used to pot electronic devices. Penetration values are measured using a Universal Penetrometer available from Precision Scientific in Chicago, Ill. and a shaft, rod and head assembly. The shaft is made of aluminum or magnesium, is 15.2 centimeters long and 0.64 centimeters in diameter. The rod is made of aluminum or magnesium, is 42 centimeters long, has a diameter of 0.48 centimeters, and weighs 15 grams. The head is blunt, made of brass, 0.48 centimeters long and has a diameter of 0.64 centimeters. The head and shaft should weigh 4.3 grams. A cured sample of gel is positioned under the head. The penetrometer dial is zeroed and the rod is lowered until the head just touches the surface of the cured gel. The penetrometer release trigger is depressed for 5 seconds. The penetrometer depth gauge is depressed and the penetration value is read from the penetrometer dial.

Compositions of the present invention cure rapidly, typically requiring about ten seconds or less of exposure to the radiation from a medium pressure mercury vapor arc lamp. The amount of energy required to cure preferred compositions is from 0.1 to about 3 joules per square centimeter, depending upon the ingredients and the thickness of the layer of curable composition applied to a substrate.

The following example is intended to describe a preferred embodiment of the present invention and should not be interpreted as limiting the scope of the invention as defined in the accompanying claims. Unless otherwise specified all parts and percentages are by weight and viscosities were measured at 25° C.

EXAMPLES

Comparative Example

A curable composition was prepared by blending the following ingredients to homogeneity.

193 parts of a dimethylvinylsiloxy-terminated poly (methyl-3,3,3-trifluoropropyl)siloxane containing 1.05% vinyl and having a viscosity of approximately 1000 centistokes 7 parts by dimethylhydrogensiloxy-terminated trifluoropropylsilsesquioxane having a viscosity of approximately 5 centistokes 0.15 parts of a complex prepared by the reaction of hexachloroplatinic acid with a liquid dimethylvinylsiloxy terminated poly(methyl-3,3,3-trifluoropropyl)siloxane 0.08 parts of 2-methyl-3-butyn-2-ol The resultant mixture was deaired under reduced pressure and 0.02 grams was dispensed into an electronic module. The module was then heated for 15 minutes at 150° C. The electrical performance of the module was then tested.

Example 1

A curable composition was prepared by blending the following ingredients to homogeneity.

70 parts of a dimethylvinylsiloxy-terminated poly (methyl-3,3,3-trifluoropropyl)siloxane containing 1.05% vinyl and having a viscosity of approximately 1000 centistokes 28 parts of a mixture having a viscosity of approximately 100 centistokes and containing 63% dimethyl, methyl(3-mercaptopropyl),3,3,3-trifluoropropylmethylsiloxane and 37% trifluoropropylmethylcyclosiloxanes 2 parts of 2-hydroxy-2-methyl-1-phenylpropan-1-one 0.015 parts of 4-methoxyphenol A 0.02 gram portion of the resultant mixture was dispensed into an electronic module. The composition was cured by exposure to 3000 millijoules of ultraviolet radiation from a medium pressure mercury vapor arc lamp. The electrical performance of the module was then tested. The electrical performance of the module containing the composition of Example 1 was better than the electrical performance of the module containing the composition of the comparative examples.

That which is claimed is:

1. An ultraviolet radiation curable fluorinated organosiloxane composition, consisting essentially of:

A) an alkenyl-substituted fluorinated polyorganosiloxane containing an average of at least two alkenyl groups per molecule and having the general formula

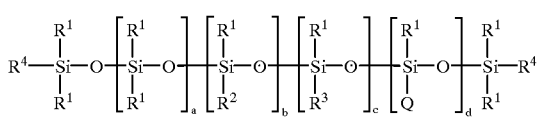

B) a mercaptoalkyl-substituted fluorinated polyorganosiloxane containing an average of at least two mercapto groups per molecule and having the general formula

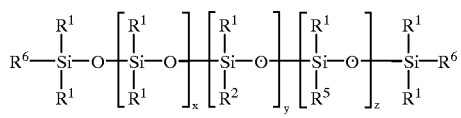

and

C) a photoinitiator in an amount sufficient to promote curing of the composition in the presence of ultraviolet radiation;

where Q is represented by the general formula

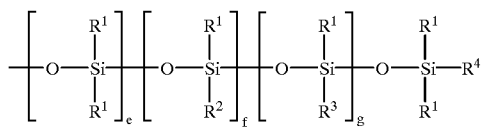

and where $R^1$ is an alkyl group, $R^2$ is a fluorinated hydrocarbon group, $R^3$ is an alkenyl group, $R^4$ is selected from the group consisting of $R^1$ and $R^3$, $R^5$ is a mercaptoalkyl group, $R^6$ is selected from the group consisting of $R^1$ and $R^5$, a is number $\geq 0$, b is a number $\geq 3$, c is a number $\geq 0$, d is a number $\geq 0$, x is a number $\geq 0$, y is a number $\geq 3$, z is a number $\geq 0$, e is a number $\geq 0$, f is a number $\geq 0$, g is a number $\geq 0$, and the sum of the average number of alkenyl groups in component A and the average number of mercapto groups in component B is greater than 4.

2. The composition according to claim 1, wherein a, b, c, d, e, f, g, x, y, and z are selected such that said composition yields, upon exposure to ultraviolet radiation, a fluorosilicone gel having a penetration value ranging from 2 to 20 millimeters.

3. The composition according to claim 1, wherein d has a value of zero.

4. The composition according to claim 1, wherein $R^1$ is an alkyl group containing from 1 to 4 carbon atoms.

5. The composition according to claim 4, wherein $R^1$ is a methyl group.

6. The composition according to claim 1, wherein $R^2$ has the general formula $RfCH_2CH_2$ where Rf is a monovalent perfluorinated hydrocarbon radical containing from 1 to about 10 carbon atoms.

7. The composition according to claim 1, wherein $R^2$ is 3,3,3-trifluoropropyl.

8. The composition according to claim 1, wherein $R^3$ is selected from the group consisting of vinyl, allyl and 5-hexynl.

9. The composition according to claim 8, wherein $R^3$ is a vinyl.

10. The composition according to claim 1, wherein $R^4$ is selected from the group consisting of vinyl, allyl, and 5-hexynl.

11. The composition according to claim 10, wherein $R^4$ is a vinyl group.

12. The composition according to claim 1, wherein $R^6$ is a methyl group.

13. The composition according to claim 1, wherein c has a value of zero.

14. The composition according to claim 1, wherein the photoinitiator is selected from the group consisting of 2-hydroxy-2-methyl-1-phenylpropan-1-one, 1-hydroxycyclohexylphenyl ketone, 2,2-diethoxyacetophenone, and 3-hydroxypropyl phenyl ketone.

15. The composition according to claim 1, wherein the photoinitiator is 2-hydroxy-2-methyl-1-phenylpropan-1-one.

16. The composition according to claim 1, wherein c has a value of zero, d has a value of zero, a, b, e, f, g, x, y, and z are selected such that said composition yields, upon exposure to ultraviolet radiation, a fluorosilicone gel having a penetration value ranging from 2 to 20 millimeters, $R^1$ is a methyl group, $R^2$ is a 3,3,3-trifluoropropyl group, $R^4$ is a vinyl group, $R^6$ is a methyl group, and the photoinitiator is 2-hydroxy-2-methyl-1-phenylpropan-1-one.

17. The composition according to claim 1, further comprising a viscosity stabilizer.

* * * * *